United States Patent
Myers et al.

(10) Patent No.: US 11,619,914 B2
(45) Date of Patent: Apr. 4, 2023

(54) ARRAYED TIME TO DIGITAL CONVERTER

(71) Applicant: Allegro MicroSystems, LLC, Manchester, NH (US)

(72) Inventors: Charles Myers, Portland, OR (US); Shunming Sun, Colorado Springs, CO (US); Adam Lee, Portland, OR (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 0 days.

(21) Appl. No.: 17/805,070

(22) Filed: Jun. 2, 2022

(65) Prior Publication Data
US 2022/0390903 A1 Dec. 8, 2022

Related U.S. Application Data
(60) Provisional application No. 63/196,395, filed on Jun. 3, 2021.

(51) Int. Cl.
*G04F 10/00* (2006.01)
*H03L 7/081* (2006.01)
(Continued)

(52) U.S. Cl.
CPC ............ *G04F 10/005* (2013.01); *H03L 7/085* (2013.01); *H03L 7/0818* (2013.01); *G01S 7/4865* (2013.01)

(58) Field of Classification Search
CPC ..... G04F 10/005; H03L 7/0818; H03L 7/085; G01S 7/4865
See application file for complete search history.

(56) References Cited

U.S. PATENT DOCUMENTS

| | | | |
|---|---|---|---|
| 6,101,197 A * | 8/2000 | Keeth | G06F 1/10 370/503 |
| 6,760,145 B1 | 7/2004 | Taylor et al. | |

(Continued)

FOREIGN PATENT DOCUMENTS

| | | | |
|---|---|---|---|
| CN | 113835333 A | * | 12/2021 |
| CN | 113917830 A | * | 1/2022 |

(Continued)

OTHER PUBLICATIONS

U.S. Appl. No. 17/809,990, filed Jun. 30, 2022, Quirk et al.
(Continued)

*Primary Examiner* — Adam D Houston
(74) *Attorney, Agent, or Firm* — Daly Crowley Mofford & Durkee, LLP

(57) ABSTRACT

Methods and apparatus for an arrayed time to digital converter (TDC) having matched delay line sampling. In embodiments, a TDC includes a coarse counter circuit to provide an event coarse timing measurement for an event, a coarse counter delivery network to deliver a count value in the coarse counter circuit to a memory storage element circuit, and an array of matched delay lines to provide an event fine timing measurement to the memory storage element circuit. An array of event sample signal generators can generate signals for the event and an array of encoders can encode fine timing measurement information from the memory storage element circuit, where an output of the encoder and the event coarse timing measurement information provide a timestamp for the event. A global delay-locked loop can incorporate a matched delay line coupled to the array of matched delay lines.

50 Claims, 9 Drawing Sheets

(51) Int. Cl.
*H03L 7/085* (2006.01)
*G01S 7/4865* (2020.01)

(56) References Cited

U.S. PATENT DOCUMENTS

| | | | |
|---|---|---|---|
| 6,778,728 B2 | 8/2004 | Taylor et al. | |
| 6,894,823 B2 | 5/2005 | Taylor et al. | |
| 6,989,921 B2 | 1/2006 | Bernstein et al. | |
| 7,015,780 B2 | 3/2006 | Bernstein et al. | |
| 7,160,753 B2 | 1/2007 | Williams, Jr. | |
| 7,432,537 B1 | 10/2008 | Huntington | |
| 7,504,053 B1 | 3/2009 | Alekel | |
| 7,764,719 B2 | 7/2010 | Munroe et al. | |
| 7,782,911 B2 | 8/2010 | Munroe et al. | |
| 7,852,549 B2 | 12/2010 | Alekel et al. | |
| 7,885,298 B2 | 2/2011 | Munroe | |
| 7,994,421 B2 | 8/2011 | Williams et al. | |
| 8,207,484 B1 | 6/2012 | Williams | |
| 8,319,307 B1 | 11/2012 | Williams | |
| 8,441,291 B2 * | 5/2013 | Hara | H03L 7/0992 327/147 |
| 8,548,014 B2 * | 10/2013 | Fermann | H01S 3/067 372/18 |
| 8,570,372 B2 | 10/2013 | Russell | |
| 8,597,544 B2 | 12/2013 | Alekel | |
| 8,630,036 B2 | 1/2014 | Munroe | |
| 8,630,320 B2 | 1/2014 | Munroe et al. | |
| 8,730,564 B2 | 5/2014 | Alekel | |
| 8,743,453 B2 | 6/2014 | Alekel et al. | |
| 8,760,499 B2 | 6/2014 | Russell | |
| 8,766,682 B2 | 7/2014 | Williams | |
| 8,853,639 B2 | 10/2014 | Williams, Jr. | |
| 9,121,762 B2 | 9/2015 | Williams et al. | |
| 9,197,233 B2 | 11/2015 | Gaalema et al. | |
| 9,269,845 B2 | 2/2016 | Williams et al. | |
| 9,368,933 B1 | 6/2016 | Nijjar et al. | |
| 9,397,469 B1 | 7/2016 | Nijjar et al. | |
| 9,447,299 B2 | 9/2016 | Schut et al. | |
| 9,451,554 B1 | 9/2016 | Singh et al. | |
| 9,466,745 B2 | 10/2016 | Williams et al. | |
| 9,553,216 B2 | 1/2017 | Williams et al. | |
| 9,591,238 B2 | 3/2017 | Lee et al. | |
| 9,693,035 B2 | 6/2017 | Williams et al. | |
| 9,759,602 B2 | 9/2017 | Williams | |
| 9,804,264 B2 | 10/2017 | Villeneuve et al. | |
| 9,810,775 B1 | 11/2017 | Welford et al. | |
| 9,810,777 B2 | 11/2017 | Williams et al. | |
| 9,810,786 B1 | 11/2017 | Welford et al. | |
| 9,812,838 B2 | 11/2017 | Villeneuve et al. | |
| 9,818,462 B1 * | 11/2017 | Polney | G11C 11/4096 |
| 9,823,353 B2 | 11/2017 | Eichenholz et al. | |
| 9,835,490 B2 | 12/2017 | Williams et al. | |
| 9,841,495 B2 | 12/2017 | Campbell et al. | |
| 9,843,157 B2 | 12/2017 | Williams | |
| 9,847,441 B2 | 12/2017 | Huntington | |
| 9,857,468 B1 | 1/2018 | Eichenholz et al. | |
| 9,869,754 B1 | 1/2018 | Campbell et al. | |
| 9,874,635 B1 | 1/2018 | Eichenholz et al. | |
| 9,897,687 B1 | 2/2018 | Campbell et al. | |
| 9,905,992 B1 | 2/2018 | Welford et al. | |
| 9,923,331 B2 | 3/2018 | Williams | |
| 9,941,433 B2 | 4/2018 | Williams et al. | |
| 9,958,545 B2 | 5/2018 | Eichenholz et al. | |
| 9,979,405 B1 * | 5/2018 | Deng | H03L 7/1976 |
| 9,989,629 B1 | 6/2018 | LaChapelle | |
| 9,995,622 B2 | 6/2018 | Williams | |
| 10,003,168 B1 | 6/2018 | Villeneuve | |
| 10,007,001 B1 | 6/2018 | LaChapelle et al. | |
| 10,012,732 B2 | 7/2018 | Eichenholz et al. | |
| 10,061,019 B1 | 8/2018 | Campbell et al. | |
| 10,088,559 B1 | 10/2018 | Weed et al. | |
| 10,094,925 B1 | 10/2018 | LaChapelle | |
| 10,114,111 B2 | 10/2018 | Russell et al. | |
| 10,121,813 B2 | 11/2018 | Eichenholz et al. | |
| 10,139,478 B2 | 11/2018 | Gaalema et al. | |
| 10,169,678 B1 | 1/2019 | Sachdeva et al. | |
| 10,169,680 B1 | 1/2019 | Sachdeva et al. | |
| 10,175,345 B2 | 1/2019 | Rhee et al. | |
| 10,175,697 B1 | 1/2019 | Sachdeva et al. | |
| 10,191,155 B2 | 1/2019 | Curatu | |
| 10,209,359 B2 | 2/2019 | Russell et al. | |
| 10,211,592 B1 | 2/2019 | Villeneuve et al. | |
| 10,211,593 B1 | 2/2019 | Lingvay et al. | |
| 10,217,889 B2 | 2/2019 | Dhulla et al. | |
| 10,218,144 B2 | 2/2019 | Munroe et al. | |
| 10,241,198 B2 | 3/2019 | LaChapelle et al. | |
| 10,254,388 B2 | 4/2019 | LaChapelle et al. | |
| 10,254,762 B2 | 4/2019 | McWhirter et al. | |
| 10,267,898 B2 | 4/2019 | Campbell et al. | |
| 10,267,899 B2 | 4/2019 | Weed et al. | |
| 10,267,918 B2 | 4/2019 | LaChapelle et al. | |
| 10,275,689 B1 | 4/2019 | Sachdeva et al. | |
| 10,295,668 B2 | 5/2019 | LaChapelle et al. | |
| 10,310,058 B1 | 6/2019 | Campbell et al. | |
| 10,324,170 B1 | 6/2019 | Engberg, Jr. et al. | |
| 10,324,185 B2 | 6/2019 | McWhirter et al. | |
| 10,338,199 B1 | 7/2019 | McWhirter et al. | |
| 10,338,223 B1 | 7/2019 | Englard et al. | |
| 10,340,651 B1 | 7/2019 | Drummer et al. | |
| 10,345,437 B1 | 7/2019 | Russell et al. | |
| 10,345,447 B1 | 7/2019 | Hicks | |
| 10,348,051 B1 | 7/2019 | Shah et al. | |
| 10,386,489 B2 | 8/2019 | Albelo et al. | |
| 10,394,243 B1 | 8/2019 | Ramezani et al. | |
| 10,401,480 B1 | 9/2019 | Gaalema et al. | |
| 10,401,481 B2 | 9/2019 | Campbell et al. | |
| 10,418,776 B2 | 9/2019 | Welford et al. | |
| 10,445,599 B1 | 10/2019 | Hicks | |
| 10,451,716 B2 | 10/2019 | Hughes et al. | |
| 10,473,788 B2 | 11/2019 | Englard et al. | |
| 10,481,605 B1 | 11/2019 | Maila et al. | |
| 10,488,496 B2 | 11/2019 | Campbell et al. | |
| 10,491,885 B1 | 11/2019 | Hicks | |
| 10,502,831 B2 | 12/2019 | Eichenholz | |
| 10,503,172 B2 | 12/2019 | Englard et al. | |
| 10,509,127 B2 | 12/2019 | Englard et al. | |
| 10,514,462 B2 | 12/2019 | Englard et al. | |
| 10,520,602 B2 | 12/2019 | Villeneuve et al. | |
| 10,523,884 B2 | 12/2019 | Lee et al. | |
| 10,535,191 B2 | 1/2020 | Sachdeva et al. | |
| 10,539,665 B1 | 1/2020 | Danziger et al. | |
| 10,545,240 B2 | 1/2020 | Campbell et al. | |
| 10,551,485 B1 | 2/2020 | Maheshwari et al. | |
| 10,551,501 B1 | 2/2020 | LaChapelle | |
| 10,557,939 B2 | 2/2020 | Campbell et al. | |
| 10,557,940 B2 | 2/2020 | Eichenholz et al. | |
| 10,571,567 B2 | 2/2020 | Campbell et al. | |
| 10,571,570 B1 | 2/2020 | Paulsen et al. | |
| 10,578,720 B2 | 3/2020 | Hughes et al. | |
| 10,591,600 B2 | 3/2020 | Villeneuve et al. | |
| 10,591,601 B2 | 3/2020 | Hicks et al. | |
| 10,606,270 B2 | 3/2020 | Englard et al. | |
| 10,612,973 B2 * | 4/2020 | Hata | H03K 5/1534 |
| 10,627,495 B2 | 4/2020 | Gaalema et al. | |
| 10,627,512 B1 | 4/2020 | Hicks | |
| 10,627,516 B2 | 4/2020 | Eichenholz | |
| 10,627,521 B2 | 4/2020 | Englard et al. | |
| 10,636,285 B2 | 4/2020 | Haas et al. | |
| 10,641,874 B2 | 5/2020 | Campbell et al. | |
| 10,663,564 B2 | 5/2020 | LaChapelle | |
| 10,663,585 B2 | 5/2020 | McWhirter | |
| 10,677,897 B2 | 6/2020 | LaChapelle et al. | |
| 10,677,900 B2 | 6/2020 | Russell et al. | |
| 10,684,360 B2 | 6/2020 | Campbell | |
| 10,732,281 B2 * | 8/2020 | LaChapelle | G01S 7/497 |
| 10,895,850 B1 * | 1/2021 | Elkholy | G04F 10/005 |
| 10,937,473 B2 * | 3/2021 | Kitagawa | G11C 7/222 |
| 10,965,294 B1 * | 3/2021 | Seetharaman | H03L 7/085 |
| 10,976,709 B1 * | 4/2021 | Moore | G01T 1/248 |
| 11,252,359 B1 | 2/2022 | Huntington et al. | |
| 11,283,459 B1 * | 3/2022 | Monk | H03L 7/0992 |
| 11,398,812 B1 * | 7/2022 | Bowman | G06F 1/10 |
| 11,526,453 B1 * | 12/2022 | Mazumder | G11C 11/4093 |
| 11,545,982 B2 * | 1/2023 | Perin | G01S 11/02 |

(56) References Cited

U.S. PATENT DOCUMENTS

| | | | | |
|---|---|---|---|---|
| 2016/0359493 | A1* | 12/2016 | Chen | H03L 7/099 |
| 2018/0069367 | A1 | 3/2018 | Villeneuve et al. | |
| 2018/0123611 | A1* | 5/2018 | Dutton | G01S 17/10 |
| 2018/0284239 | A1 | 10/2018 | LaChapelle et al. | |
| 2018/0284240 | A1 | 10/2018 | LaChapelle et al. | |
| 2018/0284275 | A1 | 10/2018 | LaChapelle | |
| 2018/0284280 | A1 | 10/2018 | Eichenholz et al. | |
| 2019/0310368 | A1 | 10/2019 | LaChapelle | |
| 2020/0051603 | A1* | 2/2020 | Kitagawa | G11C 7/1096 |
| 2021/0203340 | A1* | 7/2021 | Shi | G04F 10/005 |
| 2022/0390576 | A1* | 12/2022 | Buckbee | H03M 1/34 |
| 2022/0390903 | A1* | 12/2022 | Myers | G01S 17/894 |

FOREIGN PATENT DOCUMENTS

| | | | | |
|---|---|---|---|---|
| CN | 114153136 | A * | 3/2022 | |
| EP | 4099052 | A1 * | 12/2022 | G04F 10/005 |
| KR | 20190074169 | A * | 12/2017 | |
| TW | 201422772 | | 6/2014 | |
| WO | WO-2016124226 | A1 * | 8/2016 | G04F 10/005 |
| WO | WO-2016124227 | A1 * | 8/2016 | G04F 10/005 |

OTHER PUBLICATIONS

U.S. Appl. No. 17/663,896, filed May 18, 2022, Cadugan et al.
U.S. Appl. No. 17/660,221, filed Apr. 22, 2022, Filippini et al.
U.S. Appl. No. 17/659,035, filed Apr. 13, 2022, Cadugan et al.
U.S. Appl. No. 17/659,033, filed Apr. 13, 2022, Cadugan et al.
U.S. Appl. No. 17/656,981, filed Mar. 29, 2022, Myers et al.
U.S. Appl. No. 17/656,978, filed Mar. 29, 2022, Myers et al.
U.S. Appl. No. 17/656,977, filed Mar. 29, 2022, Myers et al.
U.S. Appl. No. 17/657,140, filed Mar. 20, 2022, Myers.
U.S. Appl. No. 17/653,881, filed Mar. 8, 2022, Keuleyan et al.
U.S. Appl. No. 17/651,250, filed Feb. 16, 2022, Marshall.
U.S. Appl. No. 17/648,702, filed Jan. 24, 2022, Lee et al.
U.S. Appl. No. 17/566,763, filed Dec. 31, 2021, Huntington et al.
U.S. Appl. No. 17/402,065, filed Aug. 13, 2021, Lee et al.
U.S. Appl. No. 17/400,300, filed Aug. 12, 2021, Myers et al.
U.S. Appl. No. 17/376,607, filed Jul. 15, 2021, Stewart et al.
U.S. Appl. No. 17/352,937, filed Jun. 21, 2021, Cadugan et al.
U.S. Appl. No. 17/230,277, filed Apr. 14, 2021, Judkins, III et al.
U.S. Appl. No. 17/230,276, filed Apr. 14, 2021, Cadugan.
U.S. Appl. No. 17/230,253, filed Apr. 14, 2021, Judkins, III et al.
U.S. Appl. No. 17/197,328, filed Mar. 30, 2021, Taylor et al.
U.S. Appl. No. 17/197,314, filed Mar. 10, 2021, Taylor et al.
Hejazi et al., "A Low-Power Multichannel Time-to-Digital Converter Using All-Digital Nested Delay-Locked Loops with 50-ps Resolution and High Throughput for LiDAR Sensors;" IEEE Transactions on Instrumentation and Measurement, vol. 69, No. 11; Nov. 2020; 10 Pages.
Markovic et al., "A High-Linearity, 17 ps Precision Time-to-Digital Converter Based on a Single-Stage Vernier Delay Loop Fine Interpolation;" IEEE Transactions on Circuits and Systems—I: Regular Papers, vol. 60, No. 3; Mar. 2013; 13 Pages.
Extended European Search Report dated Sep. 30, 2022 for European Application No. EP22177038.1; 9 Pages.

* cited by examiner

ARRAYED TIME TO DIGITAL CONVERTER

CROSS REFERENCE TO RELATED APPLICATIONS

The present application claims the benefit of U.S. Provisional Patent Application No. 63/196,395, filed on Jun. 3, 2021, which is incorporated herein by reference.

BACKGROUND

As is known in the art, arrayed active imaging systems that time the arrival of returns require parallel operation of time-to-digital converters (TDCs). One issue with highly parallel TDC systems is relatively large power supply noise which is a significant factor for analog front-end circuitry. Another issue with arrayed TDCs is the difficulty of delivering accurate and aligned clocks to the TDCs in the array, especially at high clock frequencies and/or fine clock skews.

SUMMARY

Example embodiments of the disclosure provide methods and apparatus for an imaging system that includes sampling of one or more matched delay lines to develop high-resolution timing to ensure that only a single clock reference need be delivered to arrayed TDCs. With this arrangement, the imaging system can be highly flexible in the number of supported array sizes. Further, in some embodiments the system utilizes the clock reference as a sampling mechanism instead of the fine-timing generation mechanism so as to dramatically reduce the power supply noise as only the clock tree needs to be continuously switching during TDC operation. In some embodiments, additional digital switching current draw only occurs when a timed event input is detected and only occurs on TDCs which are processing those event inputs.

In one aspect, a system having arrayed time to digital converters (TDCs) comprises: a coarse time measurement circuit comprising a coarse counter circuit to provide a coarse timing measurement for an event; a coarse counter delivery network to deliver a count value in the coarse counter circuit for the event to a coarse memory storage element circuit in a memory; a fine time measurement circuit comprising an array of matched delay lines to provide a fine timing measurement to a fine memory storage element circuit in the memory for the event; a delay-locked loop (DLL) to control a delay of the delay lines in the array of matched delay lines; event sample signal generators to receive a signal for the event and generate a sample signal to the coarse time measurement circuit and the fine time measurement circuit; and an array of encoders to encode the fine timing measurement from the fine memory storage element circuit for combining with the count value, wherein an output of the encoder and the count value provide a timestamp for the event.

A system can further include one or more of the following features: a delay locked loop (DLL) coupled to the array of matched delay lines, the DLL comprises a delay line matched to the delay lines in the array of matched delay lines, the DLL comprises a control module to control a delay of the delay lines in the array of matched delay lines, a clock tree to receive a clock signal and generate clock signals for the count delivery network and the array of event sample signal generators, the counter value is configured to correspond to a count of clock cycles from a given time to occurrence of the event, the given time includes reset of the coarse counter circuit, the fine timing measurement is configured to correspond to an amount of time from occurrence of the event, the fine timing measurement is a fraction of a clock period of a clock to the coarse counter circuit, the array of encoders convert thermometer-encoded values from outputs of the delay lines to a binary word, a total delay through each of the delay lines is one clock period of the clock to the coarse counter circuit, the total delay tracks across circuit variations, the circuit variations include power supply variation and temperature variation, an event capture timing alignment circuit, the event capture timing alignment circuit comprises a reference TDC matched to the coarse and fine TDCs, the event capture timing alignment circuit comprises a bin evaluation circuit and a calibration controller coupled to the reference TDC, the event capture timing alignment circuit comprises a test event generation circuit coupled to the reference TDC and to the calibration controller, the event capture timing alignment circuit is configured to adjust delay of the delay elements in the array of delay lines by generating a test event to the reference TDC, the event capture timing alignment circuit is configured to determine bin size errors in the fine timing measurement of the delay lines and adjust delay line delay based on mismatch, the bin evaluation circuit is configured to generate a fast, slow or match signal to the calibration controller based on the mismatch, the DLL comprises a false-lock insensitive DLL, the DLL comprises a delay adjustable delay line, a phase detector, a delay control generation module, and a dual timing reference generator, the DLL is configured for the dual timing reference generator to generate first and second repeating pulses separated in time by one cycle of a reference clock, the DLL is configured for the phase detector to receive a delayed first repeating pulse and the second pulse and generate up and down signals, and/or the DLL is configured for delay control generation module to receive the up and down signals and generate a control line to adjust a delay of the delay adjustable delay line.

In another aspect, a method comprises: employing, in a system having arrayed time to digital converters (TDCs), a coarse time measurement circuit comprising a coarse counter circuit to provide a coarse timing measurement for an event; employing a coarse counter delivery network to deliver a count value in the coarse counter circuit for the event to a coarse memory storage element circuit in a memory; employing a fine time measurement circuit comprising an array of matched delay lines to provide a fine timing measurement to a fine memory storage element circuit in the memory for the event; employing a delay-locked loop (DLL) to control a delay of the delay lines in the array of matched delay lines; employing event sample signal generators to receive a signal for the event and generate a sample signal to the coarse time measurement circuit and the fine time measurement circuit; and employing an array of encoders to encode the fine timing measurement from the fine memory storage element circuit for combining with the count value, wherein an output of the encoder and the count value provide a timestamp for the event.

A method can further include one or more of the following features: a delay locked loop (DLL) coupled to the array of matched delay lines, the DLL comprises a delay line matched to the delay lines in the array of matched delay lines, the DLL comprises a control module to control a delay of the delay lines in the array of matched delay lines, a clock tree to receive a clock signal and generate clock signals for the count delivery network and the array of event sample signal generators, the counter value is configured to correspond to a count of clock cycles from a given time to occurrence of the event, the given time includes reset of the coarse counter circuit, the fine timing measurement is configured to correspond to an amount of time from occurrence of the event, the fine timing measurement is a fraction of a clock period of a clock to the coarse counter circuit, the array of encoders convert thermometer-encoded values from outputs of the delay lines to a binary word, a total delay through each of the delay lines is one clock period of the clock to the coarse counter circuit, the total delay tracks across circuit variations, the circuit variations include power supply variation and temperature variation, an event capture timing alignment circuit, the event capture timing alignment circuit comprises a reference TDC matched to the coarse and fine TDCs, the event capture timing alignment circuit comprises a bin evaluation circuit and a calibration controller coupled to the reference TDC, the event capture timing alignment circuit comprises a test event generation circuit coupled to the reference TDC and to the calibration controller, the event capture timing alignment circuit is configured to adjust delay of the delay elements in the array of delay lines by generating a test event to the reference TDC, the event capture timing alignment circuit is configured to determine bin size errors in the fine timing measurement of the delay lines and adjust delay line delay based on mismatch, the bin evaluation circuit is configured to generate a fast, slow or match signal to the calibration controller based on the mismatch, the DLL comprises a false-lock insensitive DLL, the DLL comprises a delay adjustable delay line, a phase detector, a delay control generation module, and a dual timing reference generator, the DLL is configured for the dual timing reference generator to generate first and second repeating pulses separated in time by one cycle of a reference clock, the DLL is configured for the phase detector to receive a delayed first repeating pulse and the second pulse and generate up and down signals, and/or the DLL is configured for delay control generation module to receive the up and down signals and generate a control line to adjust a delay of the delay adjustable delay line.

BRIEF DESCRIPTION OF THE DRAWINGS

The foregoing features of this invention, as well as the invention itself, may be more fully understood from the following description of the drawings in which.

DETAILED DESCRIPTION

Figure 1:
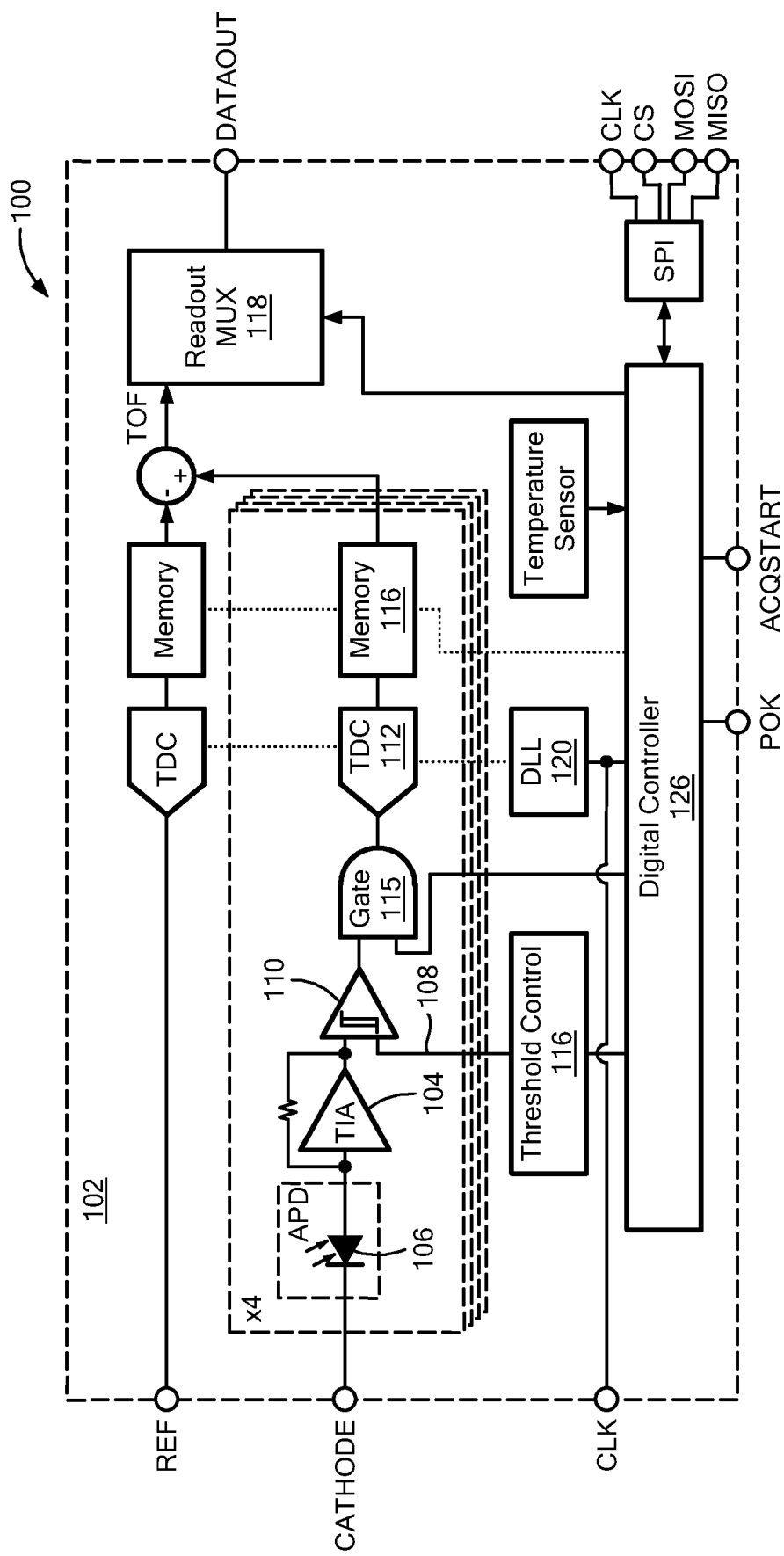
FIG. 1 shows an example imaging system having arrayed TDCs in accordance with example embodiments of the disclosure.

Prior to describing example embodiments of the disclosure some information is provided. Laser ranging systems can include laser radar (ladar), light-detection and ranging (lidar), and rangefinding systems, which are generic terms for the same class of instrument that uses light to measure the distance to objects in a scene. This concept is similar to radar, except optical signals are used instead of radio waves. Similar to radar, a laser ranging and imaging system emits a pulse toward a particular location and measures the return echoes to extract the range.

Laser ranging systems generally work by emitting a laser pulse and recording the time it takes for the laser pulse to travel to a target, reflect, and return to a photoreceiver. The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam across a target area to measure the distance to multiple points across the field of view, producing a full three-dimensional range profile of the surroundings. More advanced flash lidar cameras, for example, contain an array of detector elements, each able to record the time of flight to objects in their field of view.

When using light pulses to create images, the emitted pulse may intercept multiple objects, at different orientations, as the pulse traverses a 3D volume of space. The echoed laser-pulse waveform contains a temporal and amplitude imprint of the scene. By sampling the light echoes, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images. In a discrete-return system, each recorded return corresponds, in principle, to an individual laser reflection (i.e., an echo from one particular reflecting surface, for example, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angle of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar," "scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the return laser pulses, these instruments obtain a 3D data set (e.g., angle, angle, range)$_n$, where the index n is used to reflect that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set [e.g., angle, angle, (range-intensity)$_n$] is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar systems can include different types of lasers, including those operating at different wavelengths, including those that are not visible (e.g., those operating at a wavelength of 840 nm or 905 nm), and in the near-infrared (e.g., those operating at a wavelength of 1064 nm or 1550 nm), and the thermal infrared including those operating at wavelengths known as the "eyesafe" spectral region (i.e., generally those operating at a wavelength beyond 1300-nm, which is blocked by the cornea), where ocular damage is less likely to occur. Lidar transmitters are generally invisible to the human eye. However, when the wavelength of the laser is close to the range of sensitivity of the human eye—roughly 350 nm to 730 nm—the light may pass through the cornea and be focused onto the retina, such that the energy of the laser pulse and/or the average power of the laser must be lowered to prevent ocular damage. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors must be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those reflective objects that are not diffusively-scattering objects), the collimated laser beams can be directly reflected back, largely unattenuated. This means that—if the laser pulse is transmitted, then reflected from a target 1 meter away—it is possible that the full energy (J) from the laser pulse will be reflected into the photoreceiver; but—if the laser pulse is transmitted, then reflected from a target 333 meters away—it is possible that the return will have a pulse with energy approximately $10^{12}$ weaker than the transmitted energy. To provide an indication of the magnitude of this scale, the 12 orders of magnitude ($10^{12}$) is roughly the equivalent of: the number of inches from the earth to the sun, 10× the number of seconds that have elapsed since Cleopatra was born, or the ratio of the luminous output from a phosphorescent watch dial, one hour in the dark, to the luminous output of the solar disk at noon.

In many cases of lidar systems highly-sensitive photoreceivers are used to increase the system sensitivity to reduce the amount of laser pulse energy that is needed to reach poorly reflective targets at the longest distances required, and to maintain eyesafe operation. Some variants of these detectors include those that incorporate photodiodes, and/or offer gain, such as avalanche photodiodes (APDs) or single-photon avalanche detectors (SPADs). These variants can be configured as single-element detectors, -segmented-detectors, linear detector arrays, or area detector arrays. Using highly sensitive detectors such as APDs or SPADs reduces the amount of laser pulse energy required for long-distance ranging to poorly reflective targets. The technological challenge of these photodetectors is that they must also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy reduces the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—requires emitting 120,000 pulses [(20*10*60*10)=120,000)]. When update rates of 30 frames per second are required, such as is required for automotive lidar, roughly 3.6 million pulses per second must be generated and their returns captured.

There are many ways to combine and configure the elements of the lidar system—including considerations for the laser pulse energy, beam divergence, detector array size and array format (single element, linear, 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example—compared to the 3D lidar above—to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eyesafe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a closer-by object can be recorded, as well as the range and intensity of later reflection(s) of that pulse—one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example APDs, which along with their CMOS amplification circuits may be damaged by very intense laser pulse returns.

For example, if an automobile equipped with a front-end lidar system were to pull up behind another car at a stoplight, the reflection off of the license plate may be significant—perhaps 10^12 higher than the pulse returns from targets at the distance limits of the lidar system. When a bright laser pulse is incident on the photoreceiver, the large current flow through the photodetector can damage the detector, or the large currents from the photodetector can cause the voltage to exceed the rated limits of the CMOS electronic amplification circuits, causing damage. For this reason, it is generally advisable to design the optics such that the reflections from close objects are blurred, so that a portion of the optical energy does not reach the detector or is spread between multiple detectors.

However, capturing the intensity of pulses over a larger dynamic range associated with laser ranging may be challenging because the signals are too large to capture directly. One can infer the intensity by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

FIG. 1 shows an example active imaging system 100 having arrayed TDCs in accordance with illustrative embodiments of the disclosure. While the illustrated embodiment shows pixel and TDCs arrayed four times, it is understood that the example architecture can provide arrayed TDCs by factors of hundreds or thousands.

The active imaging system 100 includes a multi-pixel LiDAR receiver 102 based on arrayed TDCs where each pixel of the receiver simultaneously captures the timing of the reflected optical signal in response to an outgoing active laser pulse. Each pixel of the receiver 102 may observe a different portion of the overall optical field-of-view of the system. The optical return is collected and amplified using a receiver photodiode (APD) 106, for example, and analog front end (AFE) circuitry 104. The resultant voltage pulse at the output of the analog front end AFE is compared to a threshold 108 in a voltage discriminator 110, where the discriminator generates a digital pulse when the return signal exceeds the discriminator threshold. The discriminator threshold 108 can be set according to the needs for a particular application in relation to acceptable false alarms and required minimum detectable signal.

The output of the discriminator 110 then drives time-to-digital converter (TDC) circuitry 112 which captures the rising edge of the discriminator pulse, which may be output from a logic gate 115. This rising edge data can be used to determine and store time-of-flight (ToF) (range) of the return based on the reference timing signal REF. Following time-stamp generation in the TDCs 112 and memory 116, the time-stamp data for each return of each pixel is multiplexed 118 out of the digital output ports DATAOUT on the receiver 102. The arrayed TDCs 112 include pixel-based circuitry which is replicated in each pixel, as well as global circuitry that may be instantiated once within the receiver.

In embodiments, a delay locked loop (DLL) 120 can be coupled to the TDCs 112, as well as a reference TDC 124. A reference clock CLK can be provided to the receiver 102, including to the DLL 120.

While illustrative embodiments of the disclosure are shown in conjunction with an imaging system it is understood that embodiments are applicable to systems in which arrayed time measurement circuits are desirable.

Figure 2:
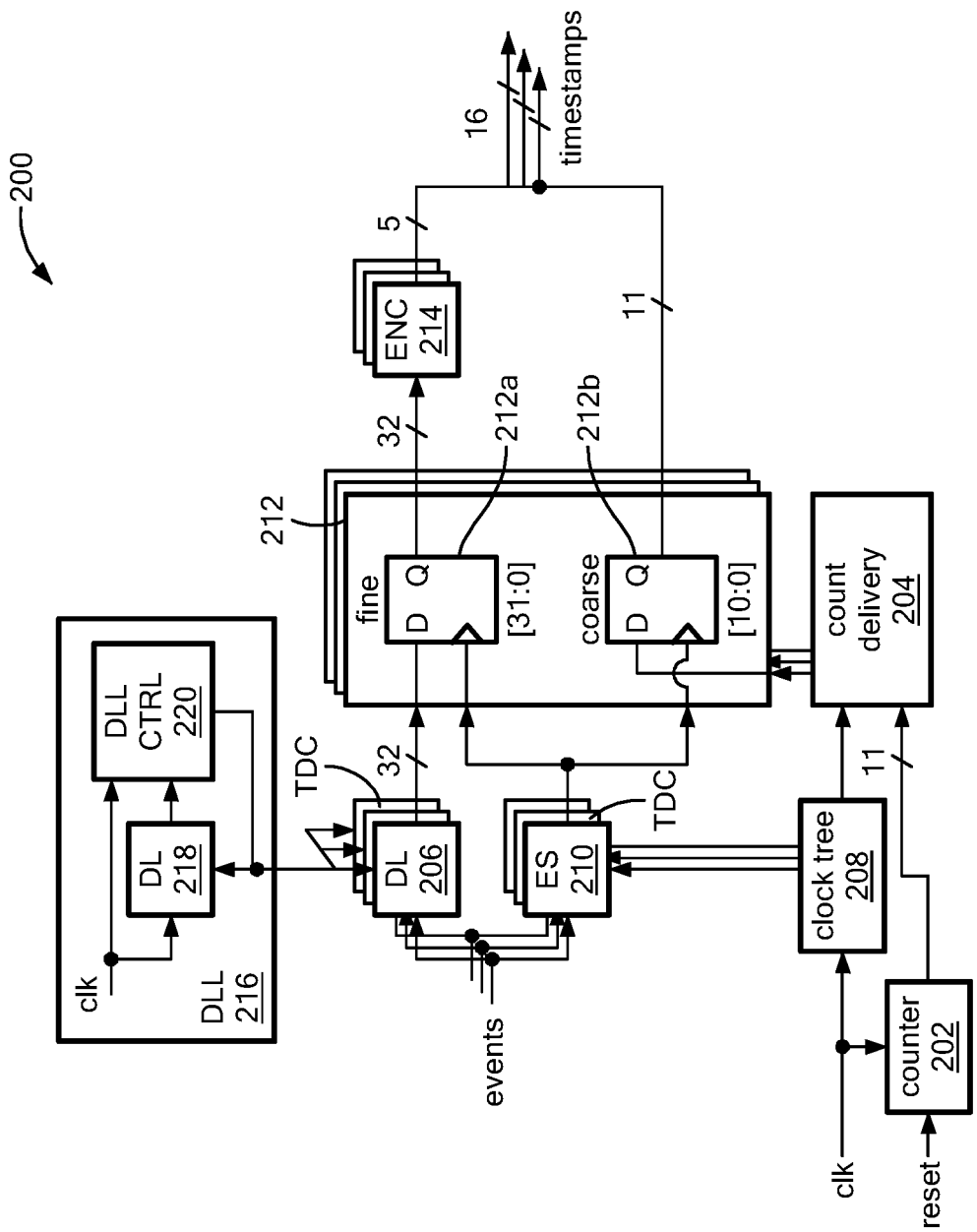
FIG. 2 shows a further detail of a portion of the system of FIG. 1.

FIG. 2 shows a portion of an example active imaging system 200, which may form a part of the system 100 of FIG. 1, having arrayed TDCs utilizing matched delay line sampling in accordance with example embodiments of the disclosure. An example system includes a digital counter circuit 202, a count delivery network 204, and an array of matched delay lines 206. A clock tree 208, which receives an input clock signal clk, distributes clock signals, such as to an array of event sample signal generators 210 and the count delivery circuit 204. Memory elements 212, which are shown as flip-flops, are coupled to the array of delay lines 206 and to the counter delivery network 204. An array of encoders 214, such as bubble-correcting thermometer-to-binary encoders, is coupled to the memory elements 212 that sample the output of the delay lines 206. Bubble-correcting thermometer-to-binary encoders are well known in the art. Timestamps are generated from a combination of the memory element 212 outputs for the sampled coarse (counter) and fine (DLs) values. A global delay-locked loop (DLL) 216 coupled to the delay line array 206 incorporates a matched delay line 218 and control module 220.

In embodiments, the TDC comprises coarse and fine time measurement and circuits required to trigger the measurement. The DLL 216, and associated delay lines 218 and 206, the fine timing memory 212a, and fine timing encoder 214 comprise the fine time measurement components of the TDC. The counter 202 and coarse sample memory 212b comprise the coarse time measurement components of the TDC. The triggering of the coarse and fine time measurement components is accomplished with the event sample (ES) 210 portion of the TDC. In example embodiments, the clock tree 208 and count delivery 204 components are not necessary for individual TDC operation but are integral to the operation of multiple TDCs sharing the same time-base. The associated components form a TDC and can be scaled to include an array of TDCs capable of measuring and outputting precise time-stamps for one or more events simultaneously, such as pulses from photodiodes exceeding a given threshold.

In embodiments, the coarse digital counter circuit 202 includes a digital code counter which increments with each clock clk transition or multiples of clock transition. Example counter encoding can comprise binary encoded, gray encoded, or other suitable format. The counter 202 values represent a coarse time base defining the number of clocks or clock multiples since the counter was reset. A counter reset may be applied just before timing acquisition. In other embodiments, a reset is never applied and the counter is allowed to continuously operate and roll-over periodically. The counter 202 may be included in multiple or in individual TDCs or provide the count value globally for the TDC array.

It should be noted that various components are provided in multiples and connected to a bus. For example, in the illustrated embodiment, an individual delay line included in the array of delay lines 206 includes thirty-two delay elements coupled to a thirty-two line bus connected to the D flip-flops in the memory 212a, which store and output 32 bits of fine timing information. In an example embodiment, the 32 bits of DL thermometer-encoded values can be converted by the encoder 214 to a five-bit binary word for combination with the coarse counter value to generate the timestamps. In the illustrated embodiment, the counter 202 value is 11-bits of coarse timing information and stored in the memory 212b.

In embodiments, the coarse counter delivery network 204 is responsible for delivering the coarse counter 202 value to each arrayed coarse time to digital converter (TDC) synchronized with a clock edge. The coarse counter delivery network 204 utilizes digital pipelining inserting latency in the counter 202 value delivery equal to some number of clocks as defined by the digital pipelining structure. The latency may be designed to be identical to all coarse TDCs in the array of TDCs or may differ by groups or individual TDCs. Known differences in TDC latency may be removed by subtracting or adding offsets in the coarse counter values captured for each TDC depending on TDC latency group until the latency is equalized for each TDC.

In example embodiments, the array of matched delay lines 206 comprises individual delay lines which are identically constructed to produce circuit structures that are maximally matched in operation and performance and are minimally sensitive to manufacturing variation. The array of matched delay lines 206 provides a fine time measurement component to the TDC.

Figure 2A:
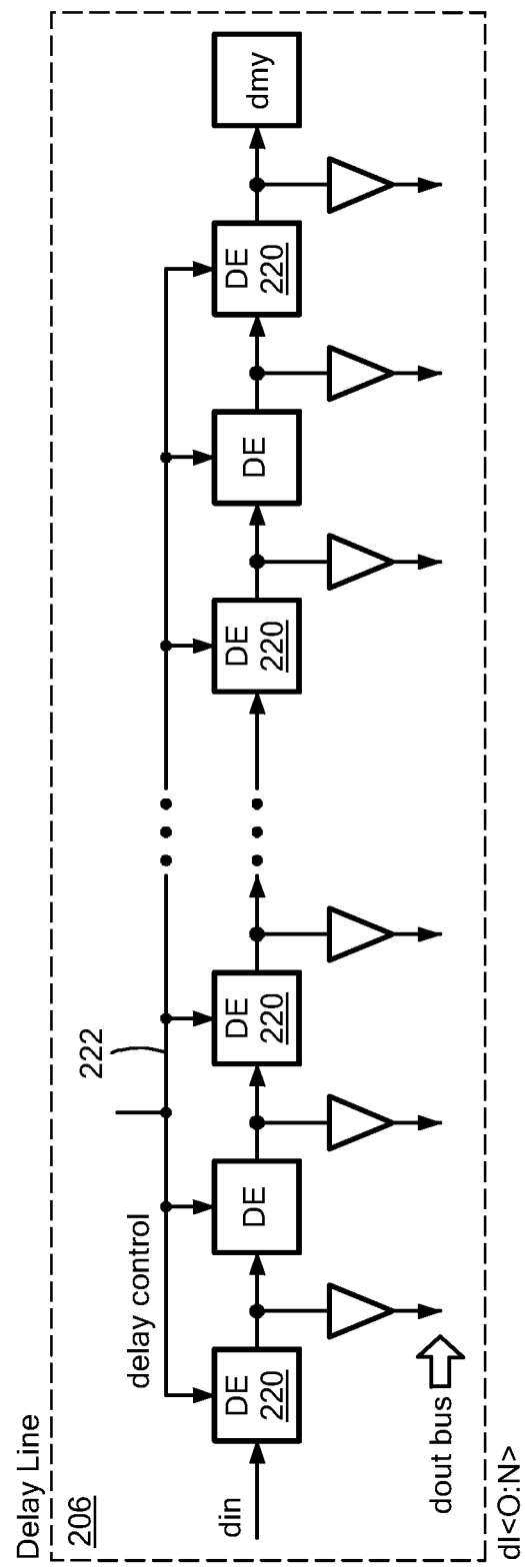
FIG. 2A is a schematic representation of an example delay line for the system of FIG. 2.

As shown in the example embodiment of FIG. 2A, each individual delay line is made up of individual delay elements 220 connected serially wherein the individual delay elements have adjustable input-to-output delay. The individual delay elements 220 take digital inputs and present them to the delay element output after the adjustable delay. The delay elements 220, which are connected serially, produce a total delay for the delay line 206 equal to the delay of the individual delay elements multiplied by the number of the individual delay elements in the delay line. For example, a delay line may comprise 32 individual delay elements where each delay element contributes to $1/32^{nd}$ of the total delay line delay from input din to output dmy.

In one embodiment, the adjustability of the delay line is accomplished by way of a voltage bias signal 222 or multiple voltage biases applied to circuits in the delay elements of the delay line. In this way, adjustment of a control voltage or voltages will either reduce or increase the digital signal delay from the input to the output of the delay line. Other embodiments control the delay line 206 delay using current inputs, adjustment of power supply voltage, or current limiting of power supplies.

Referring again to FIG. 2, the clock delivery network 208, also known as a "clock tree" ensures matched time delivery of the clock to the arrayed TDCs. The clock derived from tree 208 local to each TDC is used for clock registration and pipelining of the coarse counter delivery 204 to individual TDCs, as well as sampling the delay line array 206 and coarse counter within the arrayed TDCs.

The event sample signal generators 210 are included in each TDC to provide a single sample for the coarse and fine timing measurements in each TDC. The sample signal from the event sample signal generator 210 directs sampling of the delay line 206 outputs in an individual TDC as well as sampling of the coarse count value from the coarse count delivery module 204. In embodiments, sampling occurs on the next positive, or alternatively, negative clock edge following an input event signal arriving at the TDC timing input.

In example embodiments, memory 212 comprises digital memory storage elements 212a to hold the sampled digital value state of the delay line 206 at the moment of sampling. The memory storage elements can comprise flip-flops, latches, SRAM, and/or other suitable memory elements. The delay line 206 value represents a measurement of the time between the TDC timing event input and a reference clock edge used to generate the sampling signal and represents a fine timing measurement. Digital memory storage elements 212b are used to sample the digital value state of the coarse counter 202 bits at the first clock edge following an input event. The sampled coarse counter value 202 represents a measure of the number of clocks since the coarse counter 202 was reset and provides a coarse time measurement.

In the illustrated embodiment, the encoder 214 comprises a bubble correcting digital thermometer-to-binary encoder to convert the thermometer-encoded values sampled and stored in each TDC into a binary word. The thermometer code generated by the sampling of the delay line 206 may include "bubbles" in which the thermometer code from the delay lines 206 does not have a clear delineation between logical "1" and logical "0" regions in the thermometer code. The bubble correction portion of the example converter 214 employs an algorithm comparing adjacent thermometer code positions to identify and remove these "bubbles" in the thermometer code. The bubble-corrected thermometer code is then converted to a binary code for easy combining with coarse counter 202 code values and reduction in the number of bits (e.g., from 32 to 5) required to represent the sampled delay value.

In the illustrated embodiment, the coarse and fine digital values in the memory elements 212a, 212b are combined into a single word referred to as a time stamp that can be provided at the TDC digital output to readout or other digital systems responsible for capturing, storing, and processing the time stamp data. In the illustrated embodiment, an 11-bit coarse value and a 5-bit fine value are combined to produce a 16-bit timestamp.

The global delay-locked-loop (DLL) 216 is used to set the total delay through the matched delay lines 206 to be equal to a multiple of the clock period, such as one clock period. It is understood that any practical clock period multiple can be used to meet the needs of a particular application. The delay line 218 used the in the DLL 216 is matched to the delay lines 206 used in the TDCs. A DLL control module 220 controls a setting in the DLL 216 that configures the delay line to the desired delay and is also delivered to the entire array of delay lines 206 in the arrayed TDCs. The DLL 216 delay locking allows the delay lines 206 in the TDCs to be tuned for a clock-period-defined delay that is capable of being tracked across power supply, process corner, and temperature variations.

Example embodiments of arrayed TDCs may utilize coarse and fine timing measurement mechanisms that align the time base of these two measurements to avoid errors in the measured time of an event. The coarse time is derived from counting clock edges from a reset event, while the fine time is measured in fractions of a clock period. The triggering event samples both of these timing systems to produce a coarse and fine timing measurement that may be combined into a single measurement with measurement range of the coarse measurement and the resolution of the fine measurement. In this configuration, there may be a coarse/fine timing alignment issue at the boundary between coarse counts where the fine time measurement transitions from the maximum measurement to the minimum measurement.

A common error in conventional coarse and fine timing alignment arises from the coarse and fine timing systems making independent samples of the asynchronous timing event input and arriving at incompatible values. For example, the coarse timing may sample the event and determine that the event occurred just after a counter transition, while the fine timing may sample the same event and determine that the event occurred just before the counter transition. Such a misalignment causes an error at the level of the coarse timing resolution.

These errors can be corrected by conventional designs tracking coarse counter states and using fine measurement results to infer the coarse count that most closely matches the fine measurement captured. In practice these solutions require knowledge of the maximum possible deviations of the coarse and fine measurement systems and require significant additional correction circuitry to implement. This additional circuitry also makes the solution less desirable for arrayed systems where circuit area and power must be minimized.

If instead of parallel sampling by coarse and fine measurement sub-systems, a single sampling mechanism is utilized for both coarse and fine measurements, misalignment of coarse and fine measurements will not occur. This arrangement is not possible with a clock counter and fractional clock counter arrangement because the sampling moment is captured independently in both sub-systems. As described more fully below, example embodiments of the disclosure provide a re-arrangement of both the coarse and fine timing systems utilizing a shared, event-qualified clock edge for coarse and fine sampling allows for misalignment-free coarse and fine timing measurement.

Figure 3:
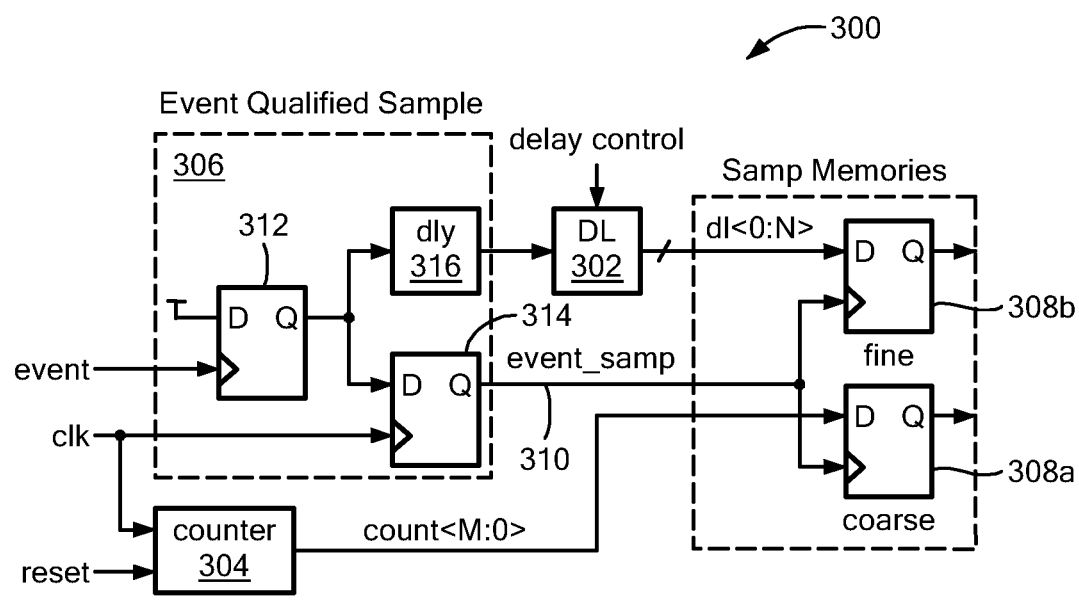
FIG. 3 is a schematic representation of an example implementation for a portion of the system of FIG. 2.

FIG. 3 shows an example system 300 implementation including arrayed TDCs having synchronized coarse and fine timing alignment. The system 300 includes a delay-adjustable delay line 302, a digital clock counter circuit 304, an event-qualified sampling circuit 306, and coarse and fine sample memories 308a,b.

As described above, the delay-adjustable delay line 302 includes a number of serially-connected and delay-adjustable delay elements. The total signal delay from the input to the end of the delay line 302 is equal to the number of delay elements times the delay element input-to-output delay. The delay line 302 in its entirety is tuned by circuitry external to the TDC to be equal to a clock period. Each delay line element output then represents a delay from the input of a fractional portion of a clock period. In the TDC circuit, an event is passed to the input of the delay line and progresses through the delay line as a delayed rising or falling edge. At any specific moment in time, a review of the delay line element outputs gives a measure of the number of fractional clock periods that have passed since the input event was presented to the input of the delay line.

The digital clock counter circuit 304 provides a coarse time base representing the number of clocks that have occurred since the counter was last reset. This counter 304 may be located within individual TDCs or external and deliver a shared clock count value to multiple TDCs. The counter 304 may increment or decrement with every clock or clock multiple and may be encoded as a binary word, gray code word, or other encoding scheme as desired.

The event-qualified sampling circuit (EQS) 306 receives an event signal indicating a timing event and provides a sampling signal 310 for sampling both coarse and fine timing measurements at the arrival of the next clock clk rising edge. In example embodiments, the circuit uses a first flip-flop 312 to capture and hold the event and a second flip-flop 314 to register the event to the next rising clock edge. The captured event is also delivered to the input of the delay line 302 to measure the difference in time between the event arrival and the next clock edge. An additional delay matching block 316 may also be added to the event-to-delay-line path to match the delay of the sample signal generation and delay-line state sample operation.

Another embodiment of the event-qualified sampling circuit uses the falling edge of the clock to trigger the sample moment with all other operations being the same. Another embodiment does not use the capture-and-hold flip-flop and instead requires the event input is held statically for at least one clock period. In another embodiment, the delay matching block is programmable allowing for adjustment of the TDC event delayed delivery to the delay line to account for variations in process, voltage, and temperature.

The sampling signal 310 generated by the event-qualified sampling circuit 306 is delivered to the coarse and fine sampling memories 308. The fine sampling memories 308b sample the state of the delay line 302 outputs at the moment of arrival of the sampling signal 310, which is a measure of the time between the event arrival and the next clock edge. The coarse sampling memories 308a sample the state of the counter 304 and, since the sample signal is clock-aligned, common digital setup-and-hold timing closure techniques can be utilized to guarantee stable counter 304 values at the moment of sample.

Figure 4:
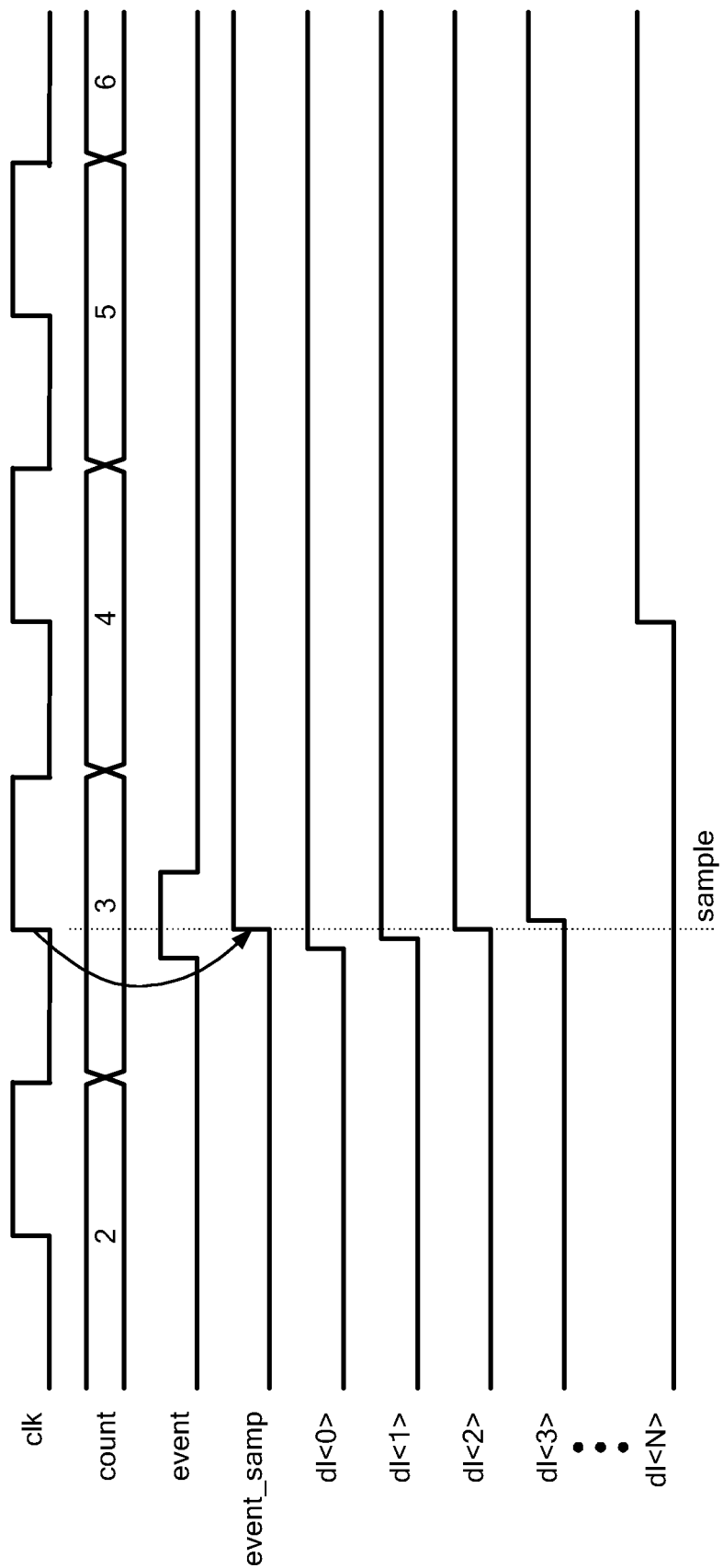
FIG. 4 is a timing diagram for signals in the system of FIG. 3.

FIG. 4 shows an example timing diagram showing a clk signal for which a falling edge cause a value Count in the counter 304 to change. The event signal clocks the first flip-flop 312 which outputs a signal to the delay block 316 and an input signal to the second flip-flop 314. The next rising edge of the clock signal clk causes the second flip-flop to output an active event_samp signal to the coarse and fine sample memories 308*a,b*. The state of the outputs dl<0:N> of the delay line elements corresponds to a fine timing measurement from the event edge transition. The fine measurement can be combined with the coarse timing measurement from the counter to provide a precise timestamp for the event.

In embodiments, a system having arrayed TDCs can include automated detection and correction of event capture timing alignment errors. TDC circuits may require precise alignment in time between the arrival of the event signal at the input of the delay line and the clock-driven delay line sampling moment within the fine capture memory. These delays can have systematic errors that need to be corrected by tuning a delay in the delay line event launch path.

Mismatch in the timing alignment of the delay line sample moment and the event departure results in an error in the "bin size" of the first and last bins of the fine-timing measurement. A TDC "bin" is a range of time for which a return in that range produces the same TDC output timestamp. An ideal TDC will have a "bin size" that is uniform and equal to the resolution of the TDC. When the event-qualified sample and event delivery to the delay line are not properly tuned, bins derived from the first and last element transitions in the delay line will be too large or small compared to all other bins. Detection of this condition is desirable to minimize errors in linearity of the time-to-digital conversion.

In addition, delay errors also vary with process corner, supply voltage, and temperature. Determining the ideal tuning delay for all these conditions and monitoring and updating the settings is a challenging problem and requires the generation of multi-point, multi-dimensional calibration tables for each individual manufactured part.

Figure 5:
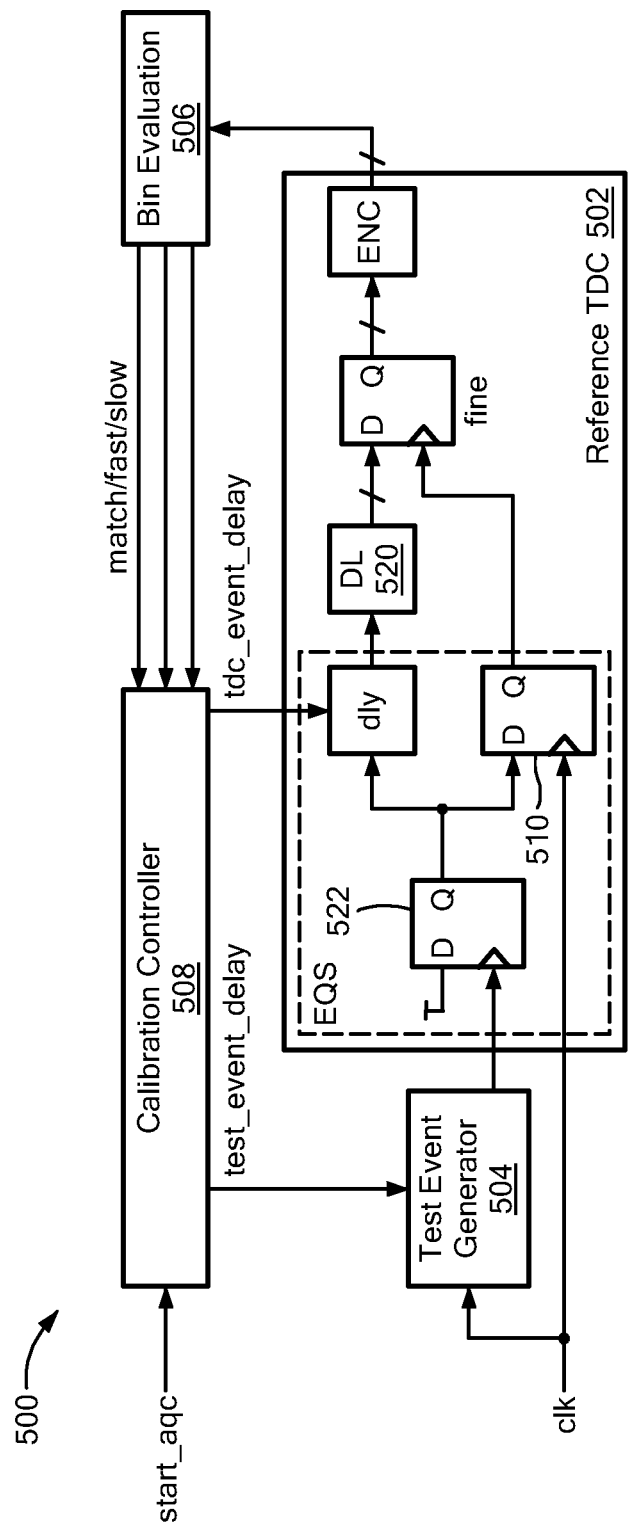
FIG. 5 is a schematic representation of an example TDC and calibration system.

FIG. 5 shows a portion of an example imaging system 500 having event capture timing alignment detection and correction provided by a reference time-to-digital converter 502, a test event generation circuit 504, a bin evaluation signal processing circuit 506, and a calibration operation controller 508.

The reference time-to-digital converter (TDC) 502 includes a matched TDC replicating the performance and function of signal-path TDCs, such as those described above, which convert input events into time-stamps. The reference TDC 502 contains the same delay line 520, event qualified sampling circuits 522, and sample memory circuits as the signal-path TDCs. In embodiments, inputs from the clock, delay line control are identical and delivered with the same system used for delivery to the signal-path TDCs. In another embodiment, a signal-path TDC is utilized for this function with input and output signal multiplexing used to connect it to the automated calibration system periodically.

The test event generation circuit 504 provides an event edge to the input of the reference TDC 502 periodically as commanded by the calibration controller 508. In one embodiment, the test event generation circuit 504 utilizes a high-precision analog delay circuit to develop a delay from a clock edge to the triggering of the test event signal. This analog delay is controllable and the adjustment steps are smaller than the minimum TDC timing resolution. The analog delay is modified by the calibration control system 508 that sweeps delay settings through a given clock edge in the TDC associated with the event-qualified sample operation.

One embodiment of the test event generation circuit 504 uses the opposite clock edge from a flip-flop 510 for example, in the event-qualified sample (EQS) in the TDC 502 as the test event delay starting point so that the given clock edge is approximately a half-clock delay from the starting point of the delay circuit 514.

Another embodiment utilizes a digital delay generation circuit using buffer gate delays to develop delay setting options. This digital delay generation circuit may operate open-loop with no element delay control, or it may operate with its own DLL and delay tuning mechanism to set a desired element delay time. Another embodiment of the test event generation circuit includes generation of a uniformly or normally distributed delay based on a random signal source, which may require histogram bin measurement that normalizes bin size based on the known random delay distribution.

The bin evaluation signal processing circuit 506 captures the fine-code results from an encoder 530 of the reference TDC 502 for each test in the sweep of test event input times. The bin evaluation signal processing circuit 506 uses the information in this sweep to determine the approximate bin size for each measured bin. One embodiment may utilize a histogram for determining bin sizes by counting the number of test event delay settings that result in each fine-code result. Another embodiment may watch for transitions in the fine bit code and track how many tests event delay points in the sweep occurred between one fine-code and the next fine-code.

Once bin sizes are obtained by the bin evaluation signal processing module 506, bin size errors in the first and last fine-code bin may be observable as one bin being larger than the median bin size, while another is smaller. These two bins are easily identified by their fine-code values (minimum and maximum fine code values). The alignment mismatch direction is then apparent from the identification of whether the first or last bin is the largest of the two.

Figure 5A:
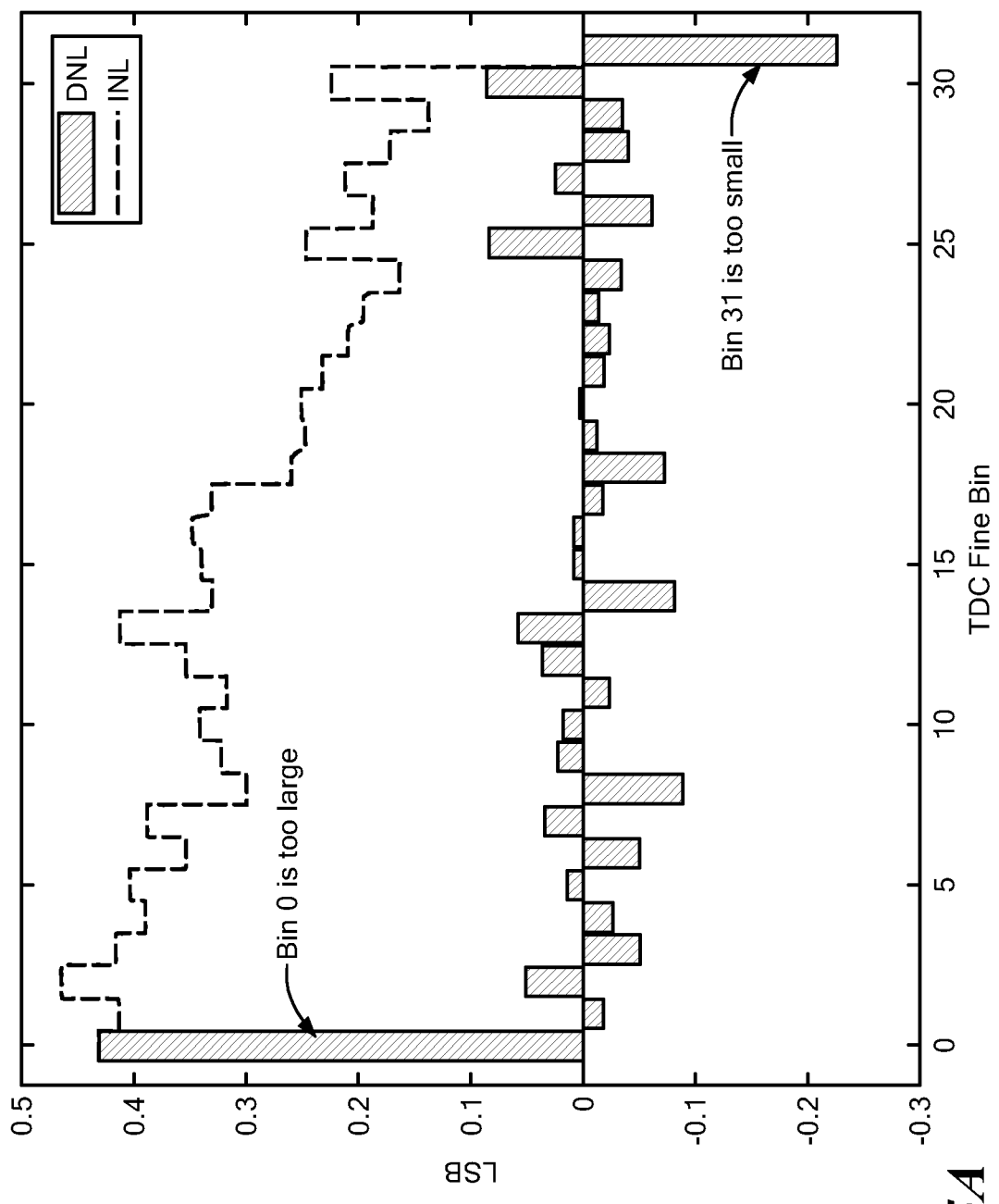
FIG. 5A shows a histogram output from a bin evaluation signal processing module that can form a part of the system of FIG. 5

For example, FIG. 5A shows an output from the bin evaluation signal processing module 506 in which Bin 0 of the fine code bins is too large and Bin 31 is too small. Accordingly, the bin evaluation signal processing circuit 506 can set a flag to modify the TDC event delay.

The bin evaluation signal processing circuit 506, after evaluating whether the first and last bin are significantly deviated from the median bin size, and after evaluating which of the first or last bin is larger than the median bin size, may set one of three status flags: match, slow, or fast. These flags indicate whether the TDC alignment of the event qualified sample and the delay line launch is aligned or requires a modification to the TDC event delay to either increase or decrease the delay.

The calibration controller 508 drives both the TDC event delay setting and the test event delay setting. The controller 508 cycles though the test event delay settings to produce the sweep result data in the reference TDC 502 and processed by the bin evaluation circuit. This sweep can either occur in a self-managed sequence controlling the reference TDC 502 read and write operations, or it may rely on the general TDC acquisition operation utilized by the signal-path TDCs.

When the automated calibration function is active, for each data acquisition cycle, the calibration controller 508 provides a test event generation delay setting incrementing or decrementing for each acquisition cycle. After completing a sweep of either all settings or a subset of the settings, the bin evaluation circuit 506 will have captured enough data to determine alignment or misalignment and direction of misalignment of the TDC event-qualified sample and event delay line launch.

The calibration controller 508 then observes the bin evaluation circuit 506 output flags and determines if the TDC event delay setting is correct or needs to be incremented or decremented. If the setting is not correct, the TDC event delay is modified and another test is performed by the calibration controller 508. This process is repeated until the bin evaluation circuit 506 indicates a match setting for the TDC event delay and event-qualified sample. The TDC event delay is delivered to all signal-path TDCs as well as the reference TDC 502. In one embodiment, the TDC event delay is updated for all TDCs simultaneously, in another embodiment, the TDC event delay is only updated for the signal-path TDCs once a new match condition is observed via the match flag from the bin evaluation circuit.

Example embodiments automatically track delay alignment and actuates a control mechanism maintaining the best setting to maintain alignment alleviates these system and manufacture test and calibration requirements.

In embodiments, a system having arrayed TDCs can include a false-lock insensitive delay locked loop. Delay locked loops (DLLs) work by comparing rising edges of a reference clock to a delayed clock and servos the delay of the delay clock until the rising edges align. This process ideally tunes the delay line to be equal to one clock period of the reference clock. Where the DLL only compares rising edges, delays of multiple reference clock periods are indistinguishable from a delay of a single reference clock period. The DLL can lock to a delay setting at one of these clock period multiples—this is known as a false lock. When the DLL is used to set the delay line for time-to-digital fractional clock measurements, a false lock introduces large errors in the fractional clock timestamp measurements.

The limit of the possible false locking positions of a DLL depends on the delay line adjustable delay range. If a design guarantees only one possible locking position within the delay line delay range, then false locking points can be avoided. Reducing the delay line delay range to only allow a single locking point is possible, but becomes difficult, if not impossible, when considering process, voltage, and temperature variations over which the delay line and DLL must operate.

In embodiments, instead of limiting the delay line delay range, the reference clock may itself be modified to restrict the possible locking points of the DLL.

Figure 6:
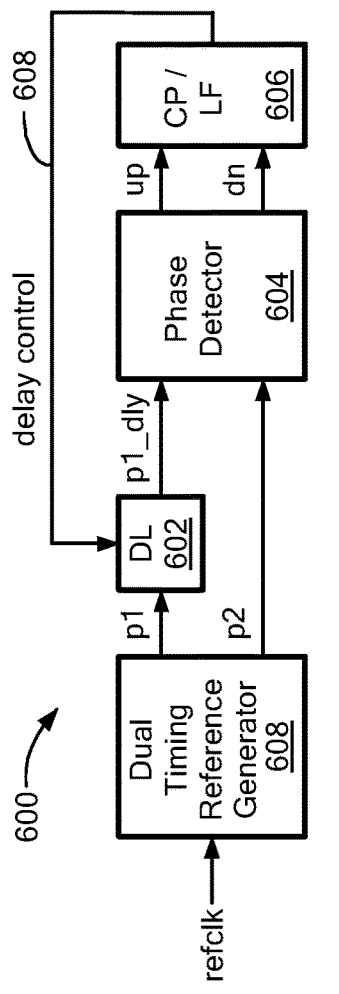
FIG. 6 is a schematic representation of an example DLL with reduced false locking sensitivity that can form a part of the system of FIG. 1.

FIG. 6 shows an example false-lock insensitive DLL 600 including a delay line 602 with an adjustable delay, a phase detector 604, a delay control generation module 606, and a dual timing reference generator 608.

The delay line 602 comprises a series of individual delay elements with an electrically adjustable delay input control, as described above for example. The modification of this control has the effect of increasing or decreasing input-to-output digital signal delay though the delay line 602. In one embodiment, delay control is one or multiple control voltages. In other embodiments, the control may be an adjustable current input or a global delay line power supply adjustment or supply current limiting.

The phase detector 604 identifies phase alignment of first and second repeating input signals and produces outputs indicating the direction of change required to align the two signals. In one embodiment, the phase detector 604 produces "up" and "down" signals which indicate whether a delay line needs to speed up or slow down to properly align two inputs. In some embodiments, the "up" and "down" pulses can occur concurrently and times when the pulses are not both on or off indicate a modification in the "up" or "down" direction is required. Also, in some embodiments, the width of the "up" or "down" pulse is proportional to the amount of delay adjustment required to align the inputs.

The delay control generation module 606 takes the output of the phase detector 604 and produces a delay control signal 608 used to adjust the delay line 602 delay setting. In one embodiment, the delay line control 608 is a single voltage input control, and the delay control generation module 606 comprises a charge pump and loop filter. The charge pump converts the "up" and "down" pulses into current pulses that are injected into the following loop filter (LF) circuit. The loop filter may comprise a single capacitor (CP), a more complex multi-order filtering network, or other suitable circuit. The output of the loop filter is a control voltage which drives the delay line delay control. When the delay line, phase detector, and delay control generator are arranged in a loop, the loop will stabilize such that the two inputs to the phase detector are aligned.

In an example embodiment, the dual timing reference generator 608 includes a circuit that creates two arbitrary repeating digital pulses p1, p2 that are separated in time by one reference clock refclk. These signals may replace the reference clock input to the DLL. The earlier of the two pulses p1, p2 is delivered to the delay line 602 input, while the later pulse is delivered directly to phase detector 604. The repetition period of the two signals p1, p2 is chosen to be a longer amount of time than the maximum delay line 602 delay setting. The DLL can only lock with a delay of one reference clock period because the delay line 602 cannot be slowed down enough to reach the next possible locking point.

Figure 7:
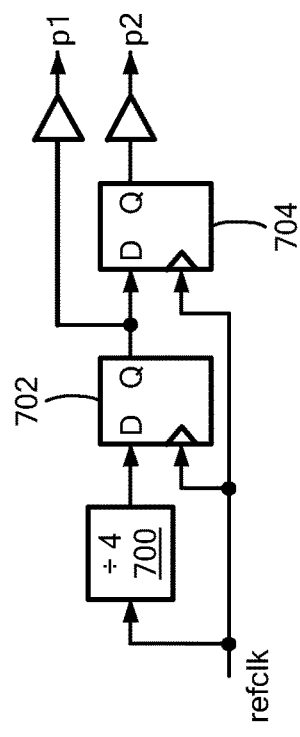
FIG. 7 is a schematic representation of a timing reference generator from FIG. 6.

In an example embodiment shown in FIG. 7, the dual timing reference generator 608 comprises a repeating pulse generator circuit 700 followed by first and second flip-flops 702, 704 in series, which can retime the pulse generator circuit 700 to the reference clock refclk and produce first and second outputs p1, p2 with exactly one reference clock delay between them. In one embodiment, the pulse generator 700 comprises a clock divider to produce the repeating pulse at a slower repetition rate than the reference clock refclk. In an alternative embodiment, clock pulses may be suppressed such that a repeating pattern is developed where every Nth clock pulse is delivered. In another embodiment, an arbitrary pulse is generated by a circular shift register passing logical 1s and 0s around the circular shift register. Other embodiments utilizing counters and logic trees may also generate the repeating pulse.

Figure 8:
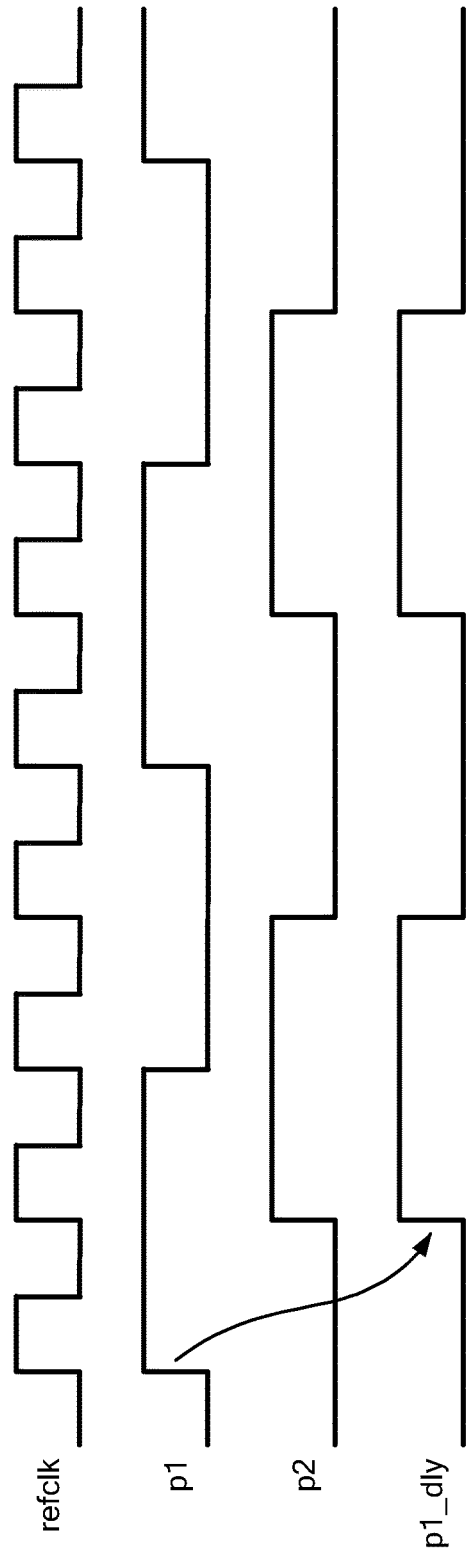
FIG. 8 is a timing diagram showing signals in the system of FIG. 6.

FIG. 8 shows an example timing diagram for the circuit of FIG. 6. The dual timing reference generator 608 receives refclk and generates first and second pulses p1, p2 separated by one reference clock delay. Pulses p1 and p2 have a period of sufficient length to prevent the loop from locking to the incorrect locking point. The delay line 602 receives the first pulse p1 and outputs a delayed first pulse signal p1_dly. The phase detector 604 receives delayed pulse signal p1_dly and the second pulse p2 and generates up and down signals based on the phase relationship of p2 and p1_dly. The up and down pulses are used by the delay control generation module 606 to modify the delay control 608 and change the delay time though the delay line 602 until the p2 and p1_delay rising edges are aligned. This is the locked state of the false-lock insensitive DLL 600.

With this arrangement, false locking points can be avoided by modifying the reference clock to restrict possible locking points for the DLL 600.

Figure 9:
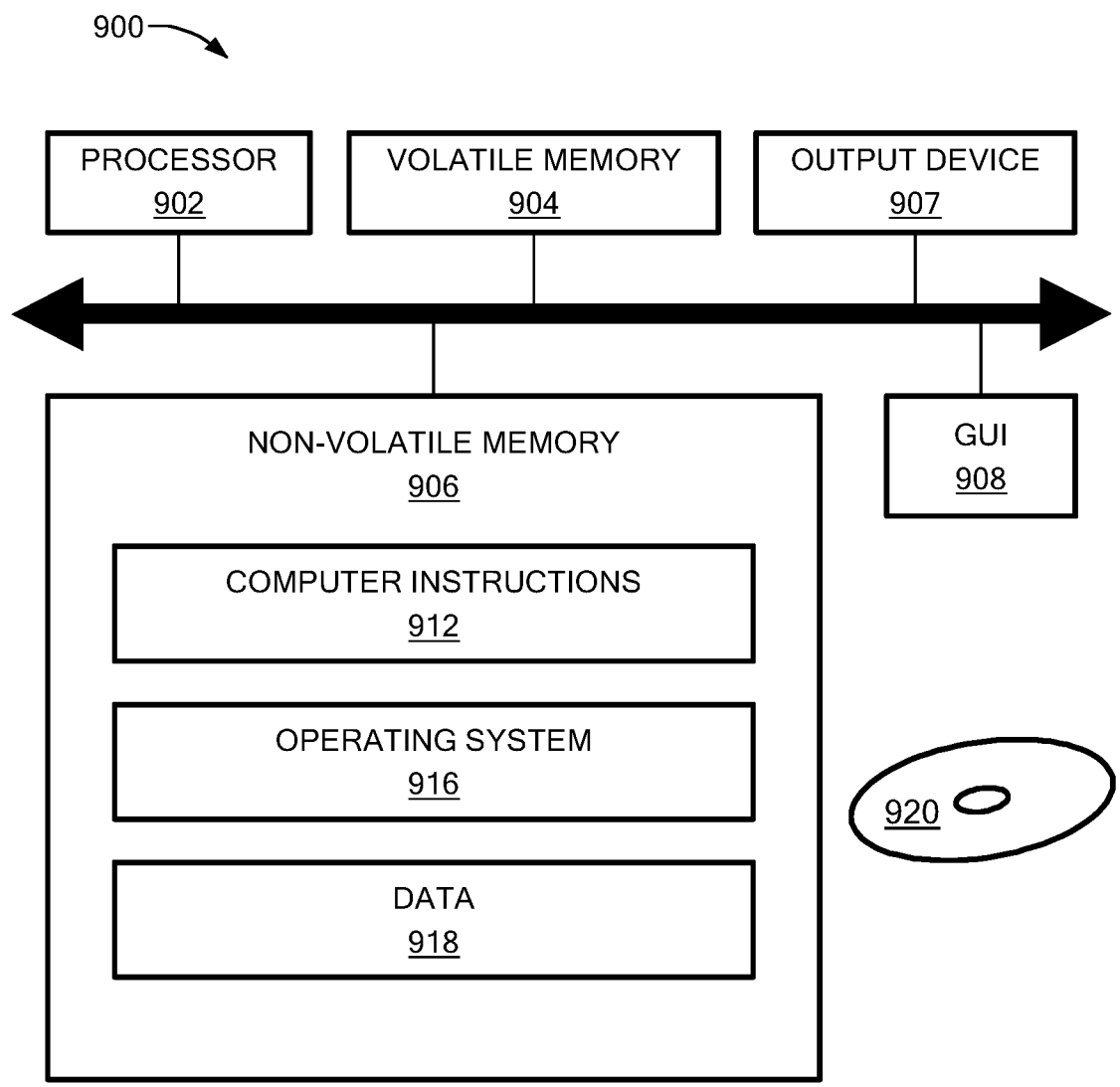
FIG. 9 is a schematic representation of an example computer that can perform at least a portion of the processing described herein.

FIG. 9 shows an exemplary computer 900 that can perform at least part of the processing described herein. The computer 900 includes a processor 902, a volatile memory 904, a non-volatile memory 906 (e.g., hard disk), an output device 907 and a graphical user interface (GUI) 908 (e.g., a mouse, a keyboard, a display, for example). The non-volatile memory 906 stores computer instructions 912, an operating system 916 and data 918. In one example, the computer instructions 912 are executed by the processor 902 out of volatile memory 904. In one embodiment, an article 920 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A system having arrayed time to digital converters (TDCs), comprising:

a coarse time measurement circuit comprising a coarse counter circuit to provide a coarse timing measurement for an event;

a coarse counter delivery network to deliver a count value in the coarse counter circuit for the event to a coarse memory storage element circuit in a memory;

a fine time measurement circuit comprising an array of matched delay lines to provide a fine timing measurement to a fine memory storage element circuit in the memory for the event;

a delay-locked loop (DLL) to control a delay of the delay lines in the array of matched delay lines;

event sample signal generators to receive a signal for the event and generate a sample signal to the coarse time measurement circuit and the fine time measurement circuit; and an array of encoders to encode the fine timing measurement from the fine memory storage element circuit for combining with the count value, wherein an output of the encoder and the count value provide a timestamp for the event.

2. The system according to claim 1, further including a delay locked loop (DLL) coupled to the array of matched delay lines.

3. The system according to claim 2, wherein the DLL comprises a delay line matched to the delay lines in the array of matched delay lines.

4. The system according to claim 2, wherein the DLL comprises a control module to control a delay of the delay lines in the array of matched delay lines.

5. The system according to claim 1, further including a clock tree to receive a clock signal and generate clock signals for the count delivery network and the array of event sample signal generators.

6. The system according to claim 1, wherein the counter value is configured to correspond to a count of clock cycles from a given time to occurrence of the event.

7. The system according to claim 6, wherein the given time includes reset of the coarse counter circuit.

8. The system according to claim 6, wherein the fine timing measurement is configured to correspond to an amount of time from occurrence of the event.

9. The system according to claim 8, wherein the fine timing measurement is a fraction of a clock period of a clock to the coarse counter circuit.

10. The system according to claim 1, wherein the array of encoders convert thermometer-encoded values from outputs of the delay lines to a binary word.

11. The system according to claim 1, wherein a total delay through each of the delay lines is one clock period of the clock to the coarse counter circuit.

12. The system according to claim 11, wherein the total delay tracks across circuit variations.

13. The system according to claim 1, wherein the circuit variations include power supply variation and temperature variation.

14. The system according to claim 1, further including an event capture timing alignment circuit.

15. The system according to claim 14, wherein the event capture timing alignment circuit comprises a reference TDC matched to the coarse and fine TDCs.

16. The system according to claim 15, wherein the event capture timing alignment circuit comprises a bin evaluation circuit and a calibration controller coupled to the reference TDC.

17. The system according to claim 16, wherein the event capture timing alignment circuit comprises a test event generation circuit coupled to the reference TDC and to the calibration controller.

18. The system according to claim 17, wherein the event capture timing alignment circuit is configured to adjust delay of the delay elements in the array of delay lines by generating a test event to the reference TDC.

19. The system according to claim 18, wherein the event capture timing alignment circuit is configured to determine bin size errors in the fine timing measurement of the delay lines and adjust delay line delay based on mismatch.

20. The system according to claim 19, wherein the bin evaluation circuit is configured to generate a fast, slow or match signal to the calibration controller based on the mismatch.

21. The system according to claim 1, wherein the DLL comprises a false-lock insensitive DLL.

22. The system according to claim 21, wherein the DLL comprises a delay adjustable delay line, a phase detector, a delay control generation module, and a dual timing reference generator.

23. The system according to claim 22, wherein the DLL is configured for the dual timing reference generator to generate first and second repeating pulses separated in time by one cycle of a reference clock.

24. The system according to claim 23, wherein the DLL is configured for the phase detector to receive a delayed first repeating pulse and the second pulse and generate up and down signals.

25. The system according to claim 24, wherein the DLL is configured for delay control generation module to receive the up and down signals and generate a control line to adjust a delay of the delay adjustable delay line.

26. A method, comprising:
employing, in a system having arrayed time to digital converters (TDCs), a coarse time measurement circuit comprising a coarse counter circuit to provide a coarse timing measurement for an event;
employing a coarse counter delivery network to deliver a count value in the coarse counter circuit for the event to a coarse memory storage element circuit in a memory;
employing a fine time measurement circuit comprising an array of matched delay lines to provide a fine timing measurement to a fine memory storage element circuit in the memory for the event;
employing a delay-locked loop (DLL) to control a delay of the delay lines in the array of matched delay lines;
employing event sample signal generators to receive a signal for the event and generate a sample signal to the coarse time measurement circuit and the fine time measurement circuit; and
employing an array of encoders to encode the fine timing measurement from the fine memory storage element circuit for combining with the count value, wherein an output of the encoder and the count value provide a timestamp for the event.

27. The method according to claim 26, further including employing a delay locked loop (DLL) coupled to the array of matched delay lines.

28. The method according to claim 27, wherein the DLL comprises a delay line matched to the delay lines in the array of matched delay lines.

29. The method according to claim 27, wherein the DLL comprises a control module to control a delay of the delay lines in the array of matched delay lines.

30. The method according to claim 26, further including employing a clock tree to receive a clock signal and generate clock signals for the count delivery network and the array of event sample signal generators.

31. The method according to claim 26, wherein the counter value is configured to correspond to a count of clock cycles from a given time to occurrence of the event.

32. The method according to claim 31, wherein the given time includes reset of the coarse counter circuit.

33. The method according to claim 31, wherein the fine timing measurement is configured to correspond to an amount of time from occurrence of the event.

34. The method according to claim 33, wherein the fine timing measurement is a fraction of a clock period of a clock to the coarse counter circuit.

35. The method according to claim 26, wherein the array of encoders convert thermometer-encoded values from outputs of the delay lines to a binary word.

36. The method according to claim 26, wherein a total delay through each of the delay lines is one clock period of the clock to the coarse counter circuit.

37. The method according to claim 36, wherein the total delay tracks across circuit variations.

38. The method according to claim 26, wherein the circuit variations include power supply variation and temperature variation.

39. The method according to claim 26, further including employing an event capture timing alignment circuit.

40. The method according to claim 39, wherein the event capture timing alignment circuit comprises a reference TDC matched to the coarse and fine TDCs.

41. The method according to claim 40, wherein the event capture timing alignment circuit comprises a bin evaluation circuit and a calibration controller coupled to the reference TDC.

42. The method according to claim 41, wherein the event capture timing alignment circuit comprises a test event generation circuit coupled to the reference TDC and to the calibration controller.

43. The method according to claim 42, wherein the event capture timing alignment circuit is configured to adjust delay of the delay elements in the array of delay lines by generating a test event to the reference TDC.

44. The method according to claim 43, wherein the event capture timing alignment circuit is configured to determine bin size errors in the fine timing measurement of the delay lines and adjust delay line delay based on mismatch.

45. The method according to claim 44, wherein the bin evaluation circuit is configured to generate a fast, slow or match signal to the calibration controller based on the mismatch.

46. The method according to claim 26, wherein the DLL comprises a false-lock insensitive DLL.

47. The method according to claim 46, wherein the DLL comprises a delay adjustable delay line, a phase detector, a delay control generation module, and a dual timing reference generator.

48. The method according to claim 47, wherein the DLL is configured for the dual timing reference generator to generate first and second repeating pulses separated in time by one cycle of a reference clock.

49. The method according to claim 48, wherein the DLL is configured for the phase detector to receive a delayed first repeating pulse and the second pulse and generate up and down signals.

50. The method according to claim 49, wherein the DLL is configured for delay control generation module to receive the up and down signals and generate a control line to adjust a delay of the delay adjustable delay line.

* * * * *